United States Patent [19]
Lu et al.

[11] Patent Number: 6,134,138
[45] Date of Patent: Oct. 17, 2000

[54] METHOD AND APPARATUS FOR READING A MAGNETORESISTIVE MEMORY

[75] Inventors: Yong Lu, Plymouth; Theodore Zhu, Maple Grove, both of Minn.

[73] Assignee: Honeywell Inc., Morristown, N.J.

[21] Appl. No.: 09/365,308

[22] Filed: Jul. 30, 1999

[51] Int. Cl.[7] .......................... G11C 11/00; G11C 11/14
[52] U.S. Cl. ...................... 365/158; 365/171; 365/173
[58] Field of Search ........................... 365/171, 173, 365/158

[56] References Cited

U.S. PATENT DOCUMENTS

| | | | |
|---|---|---|---|
| 5,477,482 | 12/1995 | Prinz | 365/158 |
| 5,864,498 | 1/1999 | Womack | 365/173 |
| 5,969,978 | 10/1999 | Prinz | 365/173 |

Primary Examiner—Trong Phan
Attorney, Agent, or Firm—Kris T. Fredrick

[57] ABSTRACT

A method and apparatus for reading a magnetoresistive memory is disclosed wherein the wordline current is turned off during selected sensing operations. This substantially eliminates the noise that is typically injected by the wordline current into the bit structures during the sensing operations, which increases the signal-to-noise ratio on the sense lines. This, in turn, significantly increases the speed of the sensing operations and thus the read access time of the memory. Substantial power savings are also realized.

20 Claims, 8 Drawing Sheets

METHOD AND APPARATUS FOR READING A MAGNETORESISTIVE MEMORY

BACKGROUND OF THE INVENTION

The present invention relates to ferromagnetic thin film memories and, more particularly, to ferromagnetic thin film memories in which states of the memory cells based on magnetization direction are determined through magnetoresistive properties of the thin film sensed by an electronic circuit.

Digital memories of various kinds are used extensively in computers and computer system components, in digital processing systems, and the like. Such memories can be formed, to considerable advantage, based on the storage of digital bits as alternative states of magnetization in magnetic materials in each memory cell, typically thin film materials. These films may be ferromagnetic thin films having information stored therein through the direction of the magnetization occurring in that film, this information being obtained through either inductive sensing to determine the magnetization state, or by magnetoresistive sensing of such states. Such ferromagnetic thin film memories may be conveniently provided on the surface of a monolithic integrated circuit to provide easy electrical interconnection between the memory cells and the memory operating circuitry.

Ferromagnetic thin film memory cells can be made very small and packed very closely together to achieve a significant density of stored digital bits, properties which permit them to be provided on the surface of a monolithic integrated circuit as indicated above. One construction, as an example, is shown in FIG. 1, where a bit structure 10 for a memory cell is presented formed over a semiconductor material body 12, as used in a monolithic integrated circuit, and directly on an insulating layer 13, itself supported on a major surface of body 12 in the integrated circuit. Only a small portion of the integrated circuit is shown, and then only a small portion of the semiconductor body is shown in that integrated circuit portion.

These bit structures in an assemblage in a memory are usually provided in a series string of such bit structures often called sense lines. There are typically a plurality of such sense lines in a memory. In order to make interconnections between members of such sense lines, or between the sense lines and the external circuitry in the integrated circuit for operating the memory, terminal regions or junctures 14 are typically provided at each end of the bit structure for interconnection purposes. These interconnections might be formed of copper alloyed in aluminum.

The remainder of the bit structure disposed on the exposed major surface of insulating layer 13 includes a lower ferromagnetic thin film 15, and an upper ferromagnetic thin film 16. Ferromagnetic thin film layers 15 and 16 typically exhibit uniaxial anisotropy, magnetoresistance, little magnetostriction, and are of an alloy composition typically comprising nickel, cobalt and iron. The lower ferromagnetic thin film 15 is typically thicker than the upper ferromagnetic thin film 16. Accordingly, the lower ferromagnetic thin film 15 is often called the hard layer, and the upper ferromagnetic thin film 16 is often called the soft layer.

Between ferromagnetic thin film layers 15 and 16 is typically a further thin layer 17 which usually would not exhibit ferromagnetism but may be either an electrical conductor or an electrical insulator. Layer 17 must, however, in this construction, minimizes the exchange interaction between layers 15 and 16 so that the magnetization vectors of each layer are decoupled. A typical choice for layer 17 would be copper. An insulating layer 18 covers bit structure 10 although only a part of it is shown in FIG. 1.

Finally, a word line 19 is shown in FIG. 1 disposed on the major surface of insulating layer 18. Word line 19 typically includes an aluminum layer alloyed with copper on a titanium-tungsten base layer. A protective and insulating layer over the entire structure of FIG. 1 is often used in practice, but is not shown here.

Bit structure 10 can be operated in a longitudinal mode having its easy axis extend between internal interconnections 14 perpendicular to the direction of word line 19, or in a transverse mode having its easy axis of magnetization parallel with the direction of word line 19. In either situation, information kept as a digital bit having one of two alternative logic values in bit structure 10 is stored therein in layer 15 by having the magnetization vector point in one direction or the other, generally along the easy axis of magnetization. If the direction of magnetization is caused to rotate from such a direction by external magnetic fields, the electrical resistance of layers 15 and 16 changes with this magnetization direction rotation because of the magnetoresistive properties of such layers. For the kinds of materials typically used in layers 15 and 16, the maximum change in resistance is on the order of a few percent of the minimum resistance value.

Sense current refers to the current flow through bit structure 10 from one terminal 14 to the other terminal 14 thereof, and word current refers to current flowing in word line 19 adjacent to, and transverse to the orientation of, bit structure 10. Bit structure 10 can be placed in one of the two possible magnetization states of layer 15 (hard layer) through the selective application of sense and word currents, i.e., information can be "written" in bit structure 10. A bit structure 10 of a typical configuration can be placed in a "0" magnetization state by the application of a sense current of typically 1.0 mA, and coincidentally with provision of a word current in one direction from 20 mA to 40 mA. The opposite magnetization state representing a "1" logic value can be provided through providing the same sense current and a word current of the same magnitude in the opposite direction. Such states typically occur fairly quickly after the proper current levels are reached, such state changes typically occurring in less than about 5 ns.

Determining which magnetization state is stored in bit structure 10, i.e., reading the information stored in bit structure 10, is typically done by providing externally caused magnetic fields in that bit structure, through providing, for example, wordline currents and sometimes coincident sense line currents. These currents rotate the magnetization of the upper ferromagnetic thin film 16 (soft layer) of the bit structure 10, but preferably not the lower ferromagnetic thin film 15 (hard layer). As indicated above, this causes a change in the electrical resistance encountered between terminal regions 14 in bit structure 10 for different magnetization directions in the structure, including changing from one easy axis direction magnetization state to the opposite direction state. As a result, there is detectable differences in the voltage developed across magnetic bit structure 10 by the sense current flowing therethrough, depending on the relative magnetization direction of the hard and soft layers of bit structure 10.

To read the state of the bit structure 10, and now referring to FIG. 2, a wordline current is typically provided over a selected bit structure in a first direction, as shown at 40. The wordline current produces an externally generated magnetic field in the bit structure 10. The magnitude of the wordline current must be large enough to rotate the soft layer 15 of the bit structure 10, but typically small enough to not rotate the hard layer 16. A typical wordline current is 10–20 mA. This may correspond to point "A" in FIG. 3 or FIG. 4, as more fully described below.

A sense current is then provided to the bit structure 10, concurrent with the wordline current, and the resulting voltage (resistance) across the bit structure 10 is sensed. If the magnetization of the soft layer 16 is parallel to the magnetization of the hard layer 15, the voltage (resistance) is relatively low, as shown, for example, at point "A" of FIG. 3. If the magnetization of the soft layer 16 is anti-parallel to the magnetization of the hard layer 15, the voltage (resistance) is higher, as shown, for example, at point "A" in FIG. 4. The sensed voltage (resistance) is then stored using an auto-zero circuit. The time typically required to sense the voltage (resistance) of the bit structure 10 is typically about 50 ns. This time is relatively long, at least in part, because of the noise generated by the relatively large wordline current that is present during the sensing operation.

After the voltage (resistance) of the bit structure is sensed with the wordline current in the first direction, the wordline current is reversed, as shown at 42 in FIG. 2. The magnitude of the wordline current is again large enough to rotate the soft layer 15 of the bit structure 10, but typically small enough to not rotate the hard layer 16. This may correspond to point "F" in FIG. 3 or FIG. 4. A sense current is then provided to the bit structure 10, concurrent with the wordline current, and the resulting voltage (resistance) across the bit structure 10 is again sensed. The time typically required to sense the voltage (resistance) of the bit structure 10 is again about 50 ns. The sensed voltage (resistance) is then compared to the previously sensed voltage (resistance) stored by the auto-zero circuit. If the resistance change is positive, one logic state is read. If the resistance change is negative, the opposite logic state is read.

The above-described reading procedure suffers from a number of disadvantages. One disadvantage is that the relatively large wordline current (10–30 mA) must be provided throughout each sensing operation. This is particularly problematic because each sensing operation may take on the order of 50 ns to sense the voltage (resistance) of the bit structure 10. Therefore, the read operation may consume a significant amount of power.

Another disadvantage is that the substantial wordline current, which must be on during each of the sense operations, often causes a significant amount of noise at the bit structure 10, which can reduce the signal-to-noise ratio on the sense lines and slow the sensing operation. One approach for reducing the noise caused by the wordline current is to provide superior wordline drivers which produce relatively stable wordline current. However, this approach may only reduce the noise injected by the wordline currents, and not eliminate it. Further, providing superior wordline drivers can increase the complexity, area, and power of the memory circuit.

SUMMARY OF THE INVENTION

The present invention overcomes many of the disadvantages of the prior art by providing a method and apparatus for reading a magnetoresistive memory whereby the wordline current is turned off during the sensing operations. This may substantially eliminate the noise that may be injected by the wordline current into the bit structures during the sensing operations, which increases the signal-to-noise ratio on the sense lines. This, in turn, can significantly increasing the speed of the sensing operations, and thus the read access time of the memory. Also, because the wordline currents are turned off during the sensing operations, significant power savings can be realized.

In accordance with one illustrative method of the present invention, a magnetic field is applied to the magnetoresistive bit structure in a first direction to set the state of the soft layer in a first direction. The magnetic field is typically generated by passing a wordline current through a wordline that passes adjacent the bit structure. Thereafter, the magnetic field is removed. With the magnetic field caused by the wordline current absent, a first resistance of the sense line that includes the magnetoresistive bit structure is sensed. This is preferably accomplished by applying a sense current to the sense line, and detecting a resulting voltage drop. Once determined, the resistance value (or voltage) is stored, preferably via an auto-zero circuit. This completes one-half of the read operation.

Thereafter, a magnetic field is applied to the magnetoresistive bit structure in the opposite direction to the first direction to set the state of the soft layer in the opposite state. The externally applied magnetic field is again removed, typically by removing the wordline current. With the externally applied magnetic field absent, the resistance of the sense line is determined, and compared to the first sensed resistance. If the resistance increased, one logic state is read. If the resistance decreased, the opposite logic state is read.

An illustrative magnetic storage device in accordance with the present invention may include an applying block, a sensing block and a control block. The applying block preferably selectively applies a magnetic field to the magnetoresistive bit structure in a first direction or a second direction to set the state of the soft layer of a selected bit structure. The applying block may include at least one wordline driver for driving a current through a wordline that passes adjacent a selected bit structure. The sensing block preferably selectively senses a resistance of a sense line that includes the magnetoresistive bit structure. The sensing block may include a current source or a voltage source for providing a current or a voltage to the sense line. The sensing block may also include an auto-zero circuit for sensing and/or storing the sensed value. The control block preferably controls the applying block and the sensing block.

The control block preferably first enables the applying block to apply a magnetic field to the magnetoresistive bit structure in a first direction to set the state of the soft layer in a first direction. The control block then preferably disables the applying block, which substantially removes the magnetic field from the bit structure. The control block then preferably initiates the sensing block to sense a first sensed resistance of the sense line that includes the magnetoresistive bit structure. The control block then disables the sensing block, and initiate the applying block to applying a magnetic field to the magnetoresistive bit structure in an opposite direction to the first direction to set the state of the soft layer in a second opposite direction. The control block then disables the applying block, which substantially removes the magnetic field from the bit structure. The control block then preferably enables the sensing block to sense if the resistance of the sense line has increased or decreased relative to the first sensed resistance. It is contemplated that the control block may be implemented using control circuitry, which may include a rudimentary state machine, a delay path, a microprocessor, or any other type of control circuit.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

The present invention provides a method and apparatus for reading a magnetoresistive memory whereby the wordline current is turned off during the sensing operations. This substantially eliminates the noise that may be injected by the wordline current into the bit structures during the sensing operations, which increases the signal-to-noise ratio on the sense lines. This, in turn, can significantly increasing the speed of the sensing operations and thus the read access time of the memory. Also, because the wordline currents are turned off during the sensing operations, significant power savings can be realized.

Figure 3:
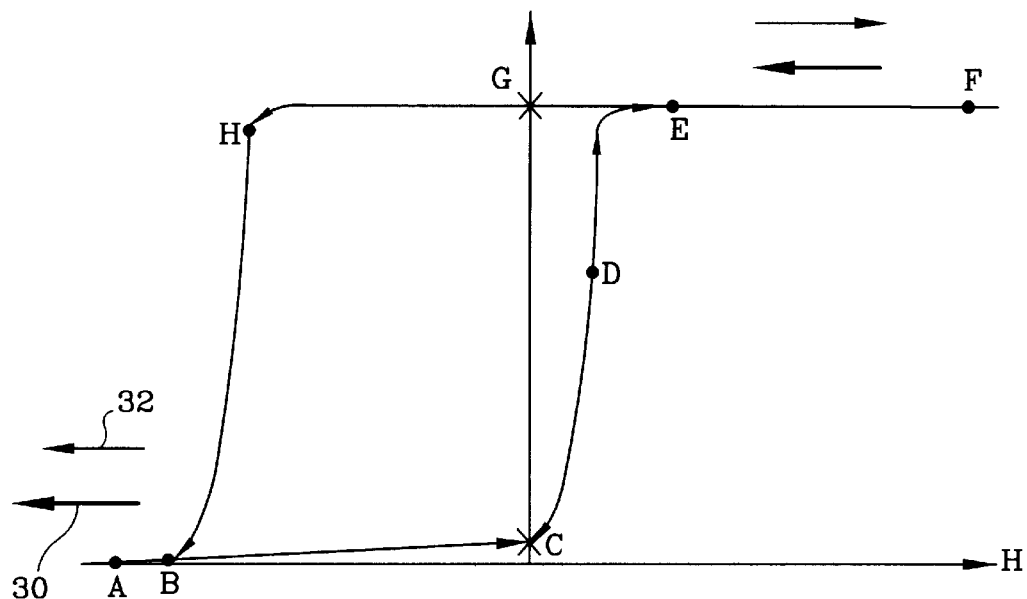
FIG. 3 is a graph showing the resistance of a typical GMR bit structure versus applied magnetic field, wherein the magnetization vectors of the soft and hard layers are initially in the same direction.
Figure 4:
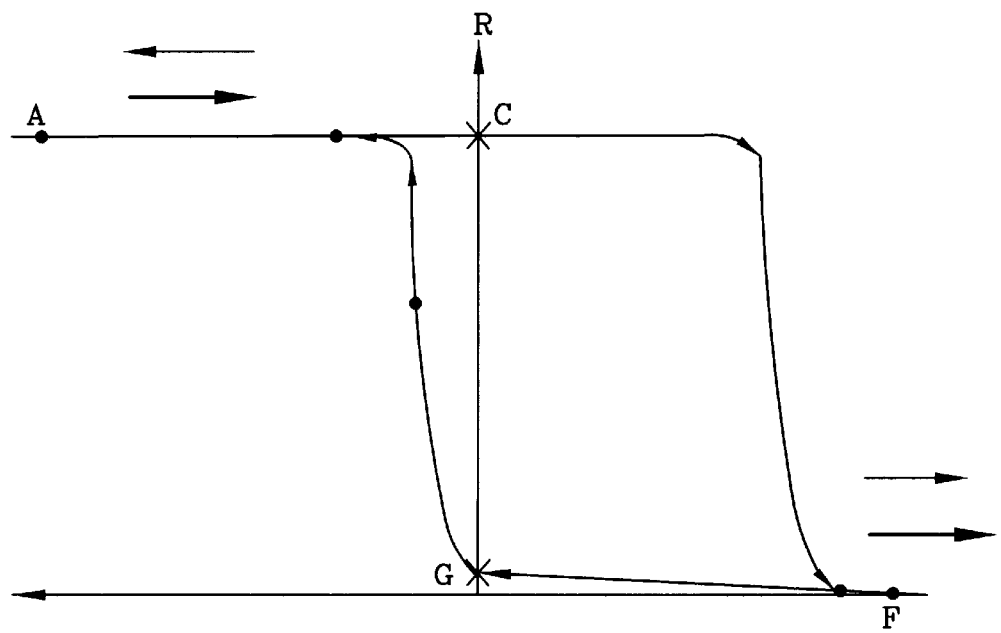
FIG. 4 is a graph showing the resistance of a typical GMR bit structure versus applied magnetic field, wherein the magnetization vector of the soft and hard layers are initially in opposite directions.

FIGS. 3–4 are graphs showing illustrative minor loops for a typical GMR (pseudo spin valve) bit structure 10. FIG. 3 shows the resistance versus applied magnetic field with the magnetization vectors of the soft and hard layers initially in the same direction (as indicated at point A). FIG. 4 shows the resistance versus applied magnetic field with the magnetization vector of the soft and hard layers are initially in opposite directions (again as indicated at point A). In both Figures, the x-axis represents the magnitude of an externally applied magnetic field that is applied to the bit structure 10, typically by a wordline current. The y-axis represents the resulting resistance of the bit structure 10, as sensed by a sense current flowing therethrough.

Referring to FIG. 3, and beginning at point "A", when the magnetization vector 30 of the hard layer 15 and the magnetization vector 32 of the soft layer 16 are aligned, the resistance of the bit structure 10 is relatively low. An externally applied magnetic field applied in the same direction as the magnetization vector 30 of the hard layer 15 and the magnetization vector 32 of the soft layer 16 merely reinforces this condition. Even when the externally applied magnetic field is reduced to zero, as shown at point "C", the resistance of the bit structure 10 remains relatively low. However, when the externally applied magnetic field is increased in the opposite direction, the magnetization vector 32 of the soft layer 16 eventually flips anti-parallel to the magnetization vector 30 of the hard layer 15, as shown at points "D" and "E". When this occurs, the resistance of the bit structure 10 increases, as shown at point "E" and "F".

To perform a write operation, the externally applied magnetic field is increased beyond point "F", which flips the magnetization vector 30 of the hard layer 15 to be parallel with the magnetization vector 32 of the soft layer 16. It is typically not desirable to write the bit structure 10 when performing a read operation, and therefore the externally applied magnetic field is typically maintained between points "A" and "F" in FIG. 3.

When the externally applied magnetic field is reduced from point "F" to zero, the resistance of the bit region 10 remains in the relatively high state, as shown at point "G", rather than retracing the path of points "E", "D" and "C". This illustrates the hysteresis typically associated with the minor loop of many GMR bit structures. Also, and as shown in FIG. 3, a larger externally applied magnetic field is typically required to rotate the magnetization vector 32 of the soft layer 16 to be parallel with the magnetization vector 30 of the hard layer 15 than to rotate the magnetization vectors 30 and 32 to an anti-parallel state. As shown, for example at point "H", the magnetic poles of the hard and soft layers tend to repel one another when so aligned. Once aligned, however, the shape anisotropy of the bit structure 10 helps maintain the magnetization vectors of the hard and soft layer in the parallel configuration. FIG. 4 shows a similar minor loop, but with the magnetization vectors of the hard and soft layers initially in an anti-parallel configuration.

Figure 1:
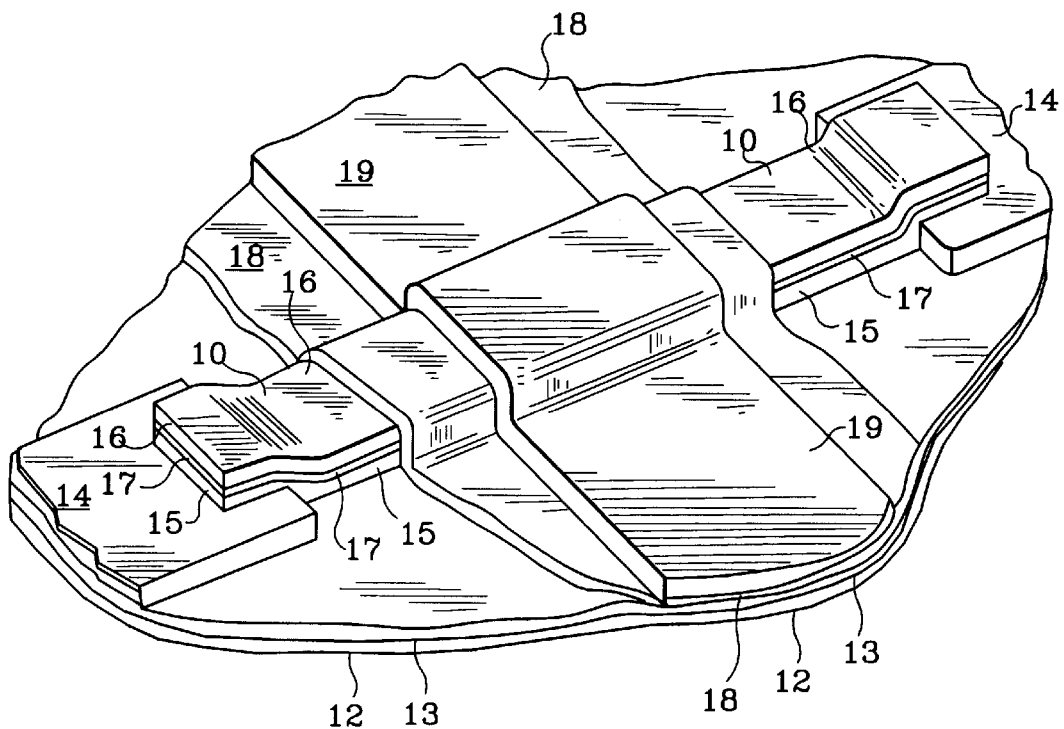
FIG. 1 is a partial cut-away perspective view of a magnetoresistive memory.
Figure 2:
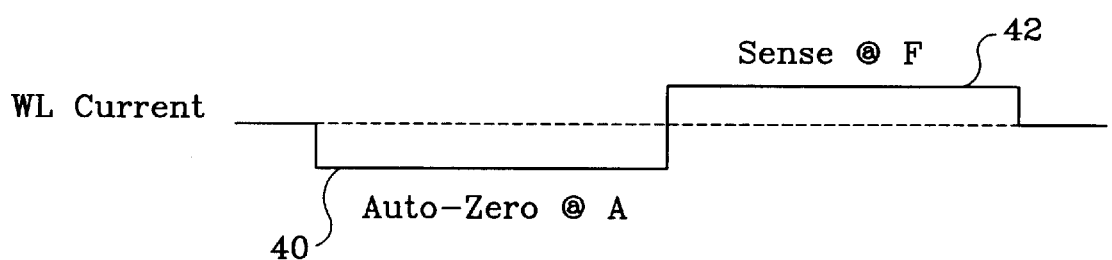
FIG. 2 is a timing diagram showing the wordline current, auto-zero and sense operations of a typical prior art read operation.
Figure 5:
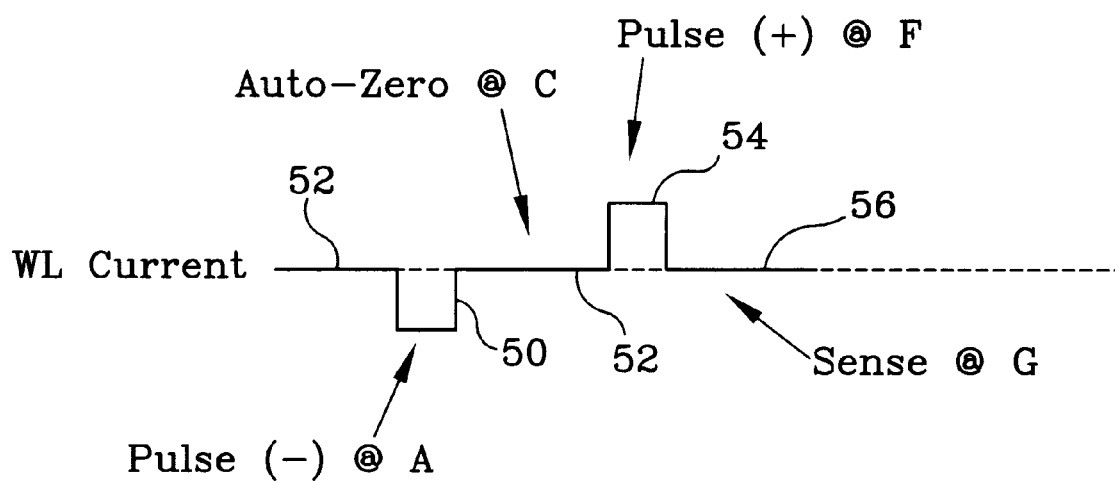
FIG. 5 is a timing diagram showing the wordline current, auto-zero and sense operations of an illustrative read operation in accordance with the present invention.

FIG. 5 is a timing diagram showing the wordline current, auto-zero and sense operations of an illustrative read operation in accordance with the present invention. To initiate the read operation, a magnetic field is applied to the magnetoresistive bit structure in a first direction. The magnetic field is typically generated by passing a wordline current through a wordline, such as wordline 19 of FIG. 1. This sets the magnetization vector 32 of the soft layer 16 to a known state. This corresponds to point "A" on FIG. 3 or FIG. 4, depending on the state (direction) of the magnetization vector 30 of the hard layer 15. The magnitude of the wordline current is preferably large enough to set the state of the soft layer, but small enough not to change the state of the hard layer. The wordline current is preferably provided in a relatively short pulse, as shown at 50, having a magnitude of about 10 to 30 mA and a duration of about 2 ns.

Thereafter, the wordline current is removed. This also removes the corresponding externally applied magnetic field from the bit structure. The resistance of the bit structure thus moves from point "A" in FIG. 3 (or FIG. 4), to point "C". With the magnetic field absent, a first resistance of the sense line that includes the magnetoresistive bit structure 10 is sensed, as shown at 52. This is preferably accomplished by applying a sense current to the sense line, and detecting a resulting voltage drop. Once determined, the resistance value (or voltage) is stored, preferably via an auto-zero type circuit (see FIGS. 6–7). This completes about one-half of the read operation.

Thereafter, the wordline current is reversed. This produces an externally generated magnetic field in a direction opposite to the first direction. Again, the magnitude of the wordline current is preferably large enough to set the state of the soft layer in the opposite state, but small enough to not change the state of the hard layer. This corresponds to point "F" in FIG. 3 (or FIG. 4). The wordline current is preferably provided in a relatively short pulse, as shown at 54, having a magnitude of about 10 to 30 mA and a duration of about 2 ns.

The wordline current is again removed, which removes the corresponding externally applied magnetic field from the bit structure 10. This corresponds to point "G" in FIG. 3 or FIG. 4. With the externally applied magnetic field absent, the resistance of the sense line is again sensed, as shown at 56, and compared to the first sensed resistance. If the resistance of the sense line increased, as illustrated in FIG. 3, one logic state is read. If the resistance decreased, as illustrated in FIG. 4, the opposite logic state is read.

As can readily be seen, the wordline current of the illustrative embodiment is only "on" for two 2 ns pulses, totaling 4 ns, during each read operation. This is substantially less than the two 50 ns pulses typically required to perform many prior art read operations. Accordingly, the present invention may reduce the read power by up to 25 times or more. Moreover, and because the wordline current is turned off during the sensing operations, less noise is injected into the bit structures by the wordline currents. This may substantially increase the signal-to-noise ratio on the sense lines, and in turn, significantly increase the speed of the sensing operations and thus the read access time of the memory.

Figure 6:
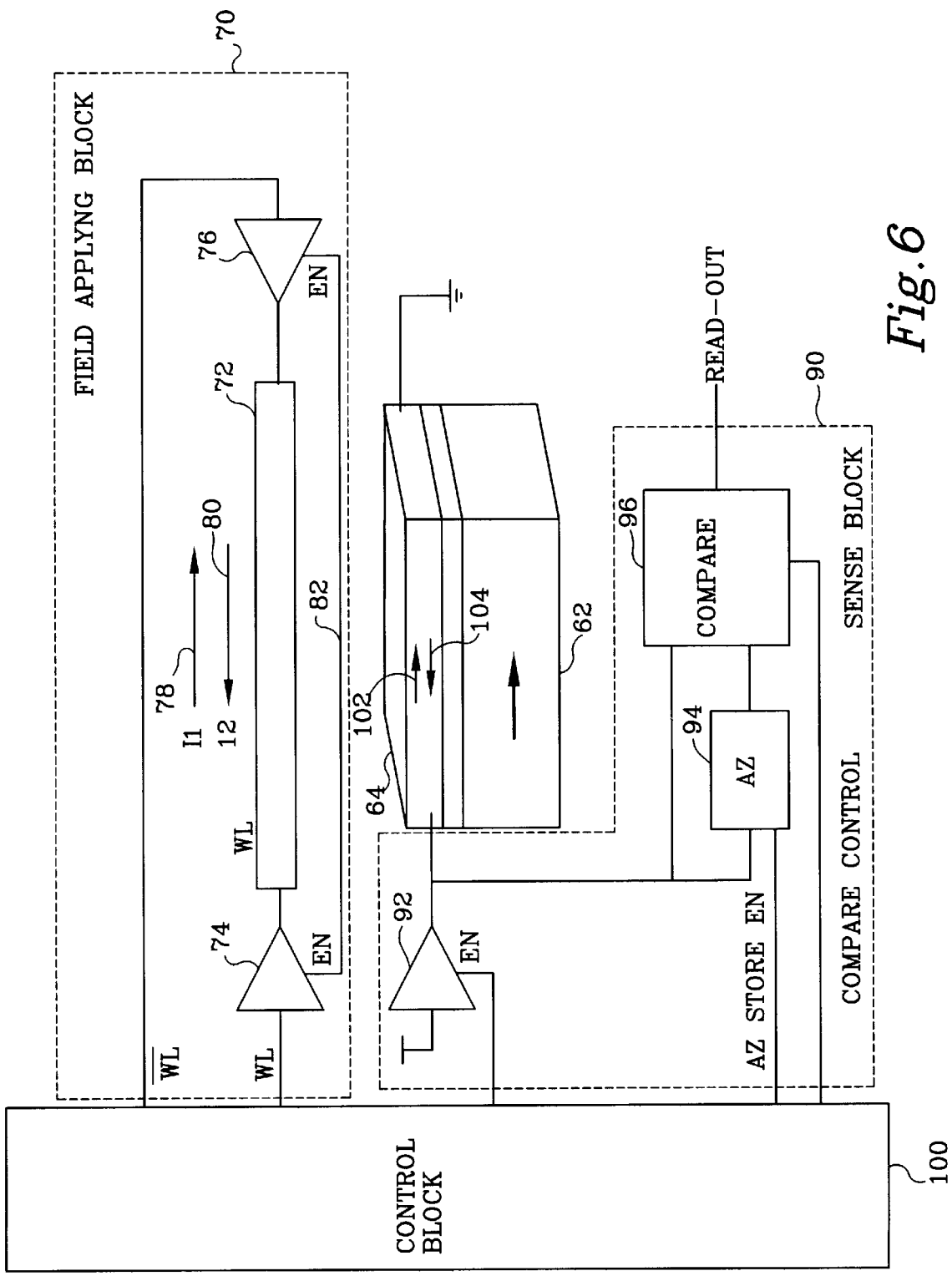
FIG. 6 is a schematic diagram showing selected parts of an illustrative magnetoresistive memory in accordance with the present invention.

FIG. 6 is a schematic diagram showing selected parts of an illustrative magnetoresistive memory in accordance with the present invention. The magnetoresistive memory includes a bit structure 60, a field applying block 70, a sense block 90 and a control block 100. The illustrative bit structure 60 includes a lower hard layer 62 and an upper soft layer 64. Although not shown, the memory preferably has a number of magnetoresistive bit structures 60 arranged in a number of rows, wherein selected bit structures in each row are connected together to form corresponding sense lines.

The field applying block 70 preferably includes a number of wordlines, wherein each wordline extends adjacent one of the bit structures in each sense line. One or more wordline drivers are preferably provided wherein each wordline driver is capable of providing a wordline current in a first direction and a second opposite direction. In the embodiment shown, wordline 72 is driven by a pair of wordline drivers 74 and 76. Wordline 72 extends physically adjacent to bit structure 60 so that the magnetic field produced by the current flowing through the wordline 72 interacts with the bit structure 60. Wordline drivers 74 and 76 are preferably controlled by control block 100. Control block 100 preferably provides opposite logic states to the inputs of wordline drivers 74 and 76. This allows the control block 100 to control which direction the wordline current flows through the wordline 72. Control block 100 may also enable/disable wordline drivers 74 and 76 via enable signal 82.

The sense block 90 preferably includes a sense driver 92 that is connected to the bit structure 60 located at one end of a sense line (only one bit structure is shown in FIG. 6). The bit structure 60 of the other end of the sense line may be connected to ground, as shown. The sense driver provides a voltage or current to the sense line to help sense the resistance of the sense line, as more fully described below. Preferably, the sense driver 92 is either a current source or a voltage source.

The sense block 90 also preferably includes an auto-zero block 94 and a compare block 96. The auto-zero block 94 selectively captures the voltage (or current) that is present at the input of the sense line. The auto-zero block 94 captures the voltage (or current) when so enabled by the control block 100. The compare block 96 compares the voltage (or current) that is stored by the auto-zero block 94 with the voltage (or current) presently at the input of the sense line. If the current voltage (or current) has increased relative to the value stored by the auto-zero block 94, one logic state is read-out. If the current voltage (or current) has decreased relative to the value stored by the auto-zero block 94, the opposite logic state is read-out.

During a read operation, the control block 100 enables the wordline drivers 74 and 76 via enable signal 82, and provides a first logic state to wordline driver 74 and the opposite logic state to wordline driver 76. This produces a wordline current 78 in a first direction, which produces a magnetic field in bit structure 60 in a first direction. This sets the state of the soft layer 64 in a first direction 102. The control block 100 then disables the wordline drivers 74 and 76 via enable signal 82, which substantially removes the magnetic field produced by the wordline current from the bit structure 60. The control block 100 then enables the sense driver 92, which produces a voltage or current to the sense line. The auto-zero block 94 is then enabled to store the voltage or current presently at the input of the sense line. Control block 100 then disables the auto-zero block 94 and the sense driver 92. This completes a first part of the read operation.

Thereafter, the control block 100 enables the wordline drivers 74 and 76 via enable signal 82, and provides a second logic state to wordline driver 74 and the opposite logic state to wordline driver 76. This produces a wordline current 80 in a second direction, which produces a magnetic field in bit structure 60 in a second direction. This sets the state of the soft layer 64 in a second opposite direction 104. The control block 100 then disables the wordline drivers 74 and 76 via enable signal 82, which substantially removes the magnetic field produced by the wordline current from the bit structure 60. The control block 100 then enables the sense driver 92, which produces a voltage or current to the sense line. The compare block 96 is then enabled to compare the voltage (or current) that is stored by the auto-zero block 94 with the voltage (or current) presently at the input of the sense line. If the voltage (or current) has increased relative to the value stored by the auto-zero block 94, one logic state is read-out. If the voltage (or current) has decreased relative to the value stored by the auto-zero block 94, the opposite logic state is read-out.

Figure 7:
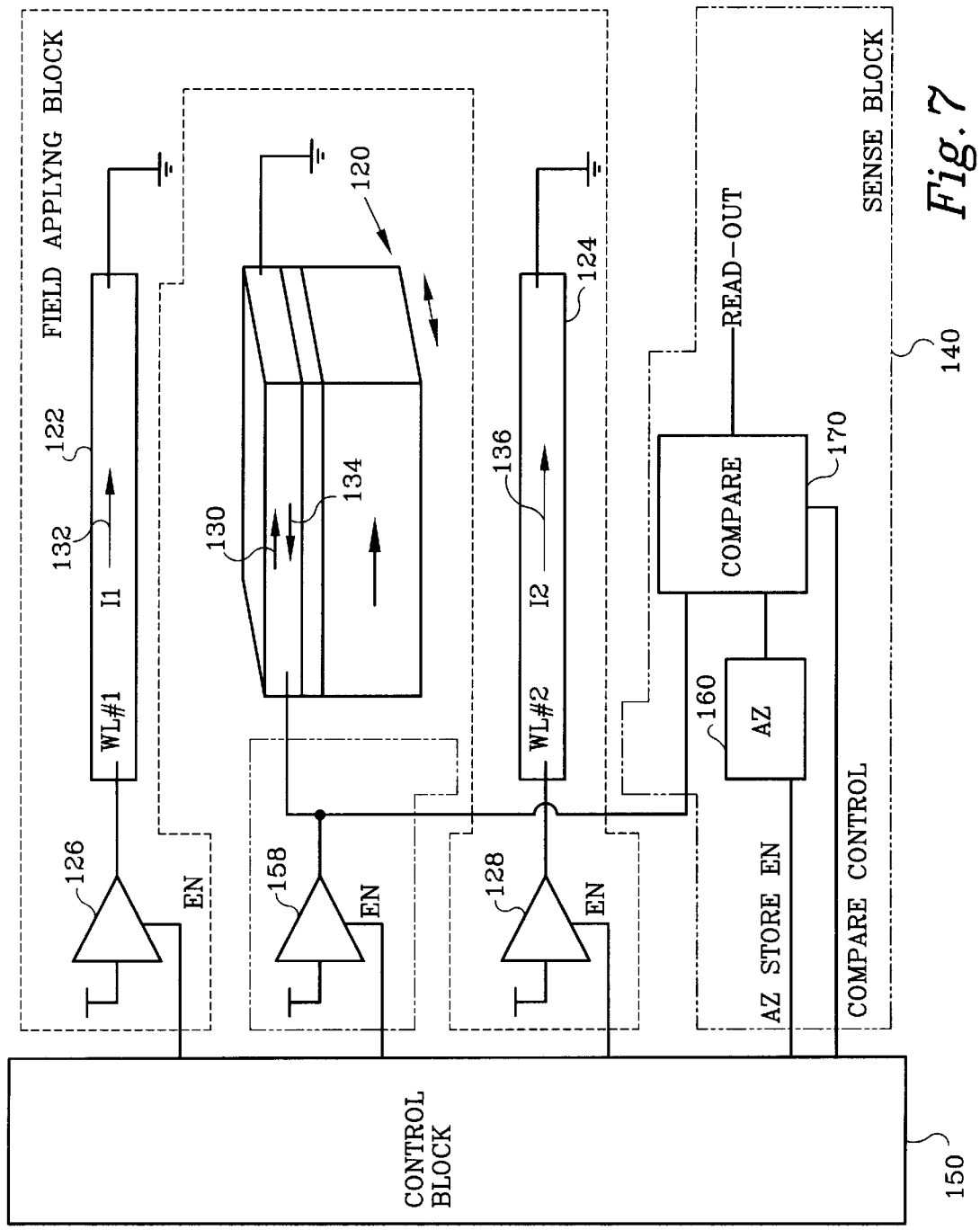
FIG. 7 is a schematic diagram showing selected parts of another illustrative magnetoresistive memory in accordance with the present invention.

FIG. 7 is a schematic diagram showing selected parts of another illustrative magnetoresistive memory in accordance with the present invention. In this embodiment, a pair or wordlines 122 and 124 are provided, one just above and one just below a bit structure 120. This configuration allows the wordline drivers 126 and 128 to drive wordline current in a single direction, potentially simplifying the design of the wordline drivers. To set the magnetization vector of the soft layer to a first state 130, a current 132 is driven down the upper wordline 122. To set the magnetization vector of the soft layer to the opposite state 134, a current 136 is driven down the lower wordline 124. The sense block 140 is preferably the same as described above with respect to FIG. 6.

During a read operation, the control block 150 first enables wordline driver 126 to provide a current 132 down the upper wordline 122. This sets the state of the soft layer of the bit structure 120 in a first direction 130. It is recognized that the wordline current may be provided down the lower wordline 124 first, followed by the upper wordline 122. In any event, the control block 150 then disables wordline driver 126, which removes the magnetic field produced by the wordline current from the bit structure 120. The control block 150 then enables the sense driver 158, which produces a voltage or current to the sense line. The auto-zero block 160 is then enabled to store the voltage or current at the input of the sense line. Control block 150 then disables the auto-zero block 160 and the sense driver 158. This completes a first part of the read operation.

Thereafter, the control block 150 enables wordline driver 128 to provide a current 136 down the lower wordline 124. This sets the state of the soft layer in a second opposite direction 134. The control block 150 then disables the wordline driver 128, which substantially removes the magnetic field produced by the wordline current from the bit structure 120. The control block 150 then enables the sense driver 158, which drives a voltage or current to the sense line. The compare block 170 is then enabled to compare the voltage (or current) that is stored by the auto-zero block 160 with the voltage (or current) presently at the input of the sense line. If the voltage (or current) has increased relative to the value stored in the auto-zero block 160, one logic state is read-out. If the voltage (or current) has decreased relative to the value stored by the auto-zero block 160, the opposite logic state is read-out.

Figure 8:
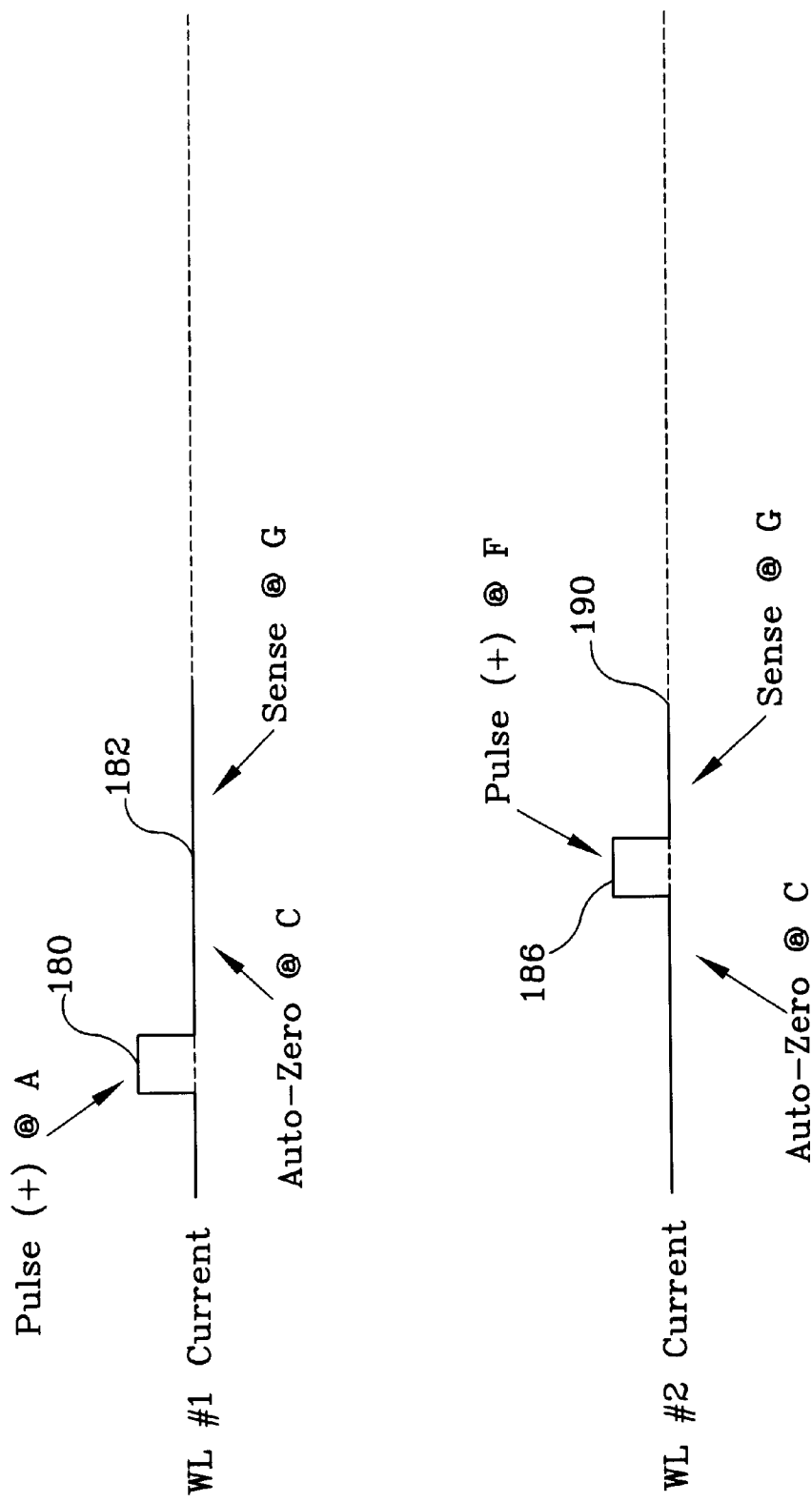
FIG. 8 is a timing diagram showing the wordline currents, auto-zero and sense operations of an illustrative read operation of the magnetoresistive memory of FIG. 7.

FIG. 8 is a timing diagram showing the wordline currents, auto-zero and sense operations of an illustrative read operation using the magnetoresistive memory of FIG. 7. The control block 150 enables wordline driver 126, which drives a current pulse down the upper wordline 122, as shown at 180. The control block 150 then disables wordline driver 126, which removes the wordline current. Once the current in the upper wordline 122 is removed, the sense driver 158 is enabled, and the auto-zero block 160 stores the voltage (or current) at the input of the sense line, as shown at 182. Thereafter, the control block 150 enables wordline driver 128, which drives a current pulse down the lower wordline 124, as shown at 186. Control block 150 then enables the sense driver 158 to provide a voltage (or current) down the sense line, as shown at 190. The compare block 170 is then enabled to compare the voltage (or current) stored by the auto-zero block 160 to the voltage (or current) currently being sensed. If the voltage (or current) has increased relative to the value stored by the auto-zero block 160, one logic state is read-out. If the voltage (or current) has decreased relative to the value stored by the auto-zero block 160, the opposite logic state is read-out.

Figure 9:
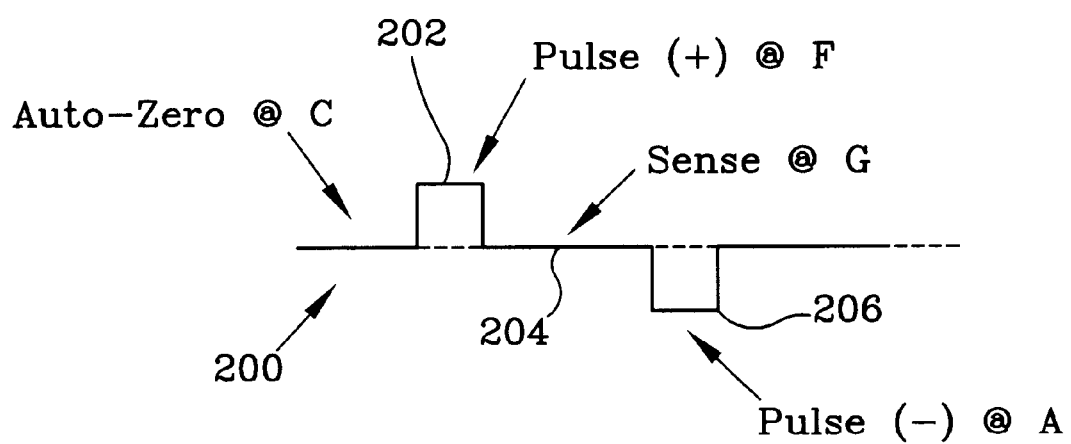
FIG. 9 is a timing diagram showing the auto-zero, sense and wordline current operations of another illustrative read operation in accordance with the present invention.

FIG. 9 is a timing diagram showing the auto-zero, sense and wordline current operations of another illustrative read operation in accordance with the present invention. This embodiment operates similar to FIG. 5. However, the soft layer 16 is initialized to a predetermined initial state (e.g. the negative wordline current direction) before each read operation is initiated. The predetermined initial state may corresponds to, for example, point "A" on FIG. 3 or FIG. 4. Accordingly, the first wordline pulse 50 of FIG. 5 is no longer needed before the auto-zero and sense operations of FIG. 5. This provides an improved data access time relative to the embodiment shown in FIG. 5.

Referring specifically to FIG. 9, a read operation is performed by first sensing the resistance of a selected bit structure without a wordline current present, as shown at 200. Because the soft layer is already initialized to the predetermined initial state, the resistance of the bit structure will correspond to, for example, point "C" in FIG. 3 (or FIG. 4). Once determined, the resistance value (or voltage) is stored, preferably via an auto-zero type circuit (see FIGS. 6–7).

Thereafter, a wordline current is applied to produce an externally generated magnetic field that reverses the state of the soft layer 16. In the example shown, a positive wordline current pulse 202 is applied, which may correspond to point "F" in FIG. 3 (or FIG. 4). The wordline current is preferably provided in a relatively short pulse having a magnitude of about 10 to 30 mA and a duration of about 2 ns.

The wordline current is then removed, which removes the corresponding externally applied magnetic field from the bit structure 10. The state of the bit structure may then correspond to point "G" in FIG. 3 or FIG. 4. With the externally applied magnetic field absent, the resistance of the sense line is again sensed, as shown at 204, and compared to the first sensed resistance. If the resistance of the sense line increased, as illustrated in FIG. 3, one logic state is read. If the resistance decreased, as illustrated in FIG. 4, the opposite logic state is read.

After the data is accessed, the state of the soft layer 16 is reset to the predetermined initial state. To do so, a wordline current is applied to produce an externally generated magnetic field that sets the state of the soft layer 16 to the predetermined initial state. In the example shown, a negative wordline current pulse 206 is applied to set the state of the soft layer 16 to, for example, point "A" on FIG. 3 or FIG. 4. It is recognized that the state of the soft layer 16 may also be set to the predetermined initial state after each write operation.

Having thus described the preferred embodiments of the present invention, those of skill in the art will readily appreciate that the teachings found herein may be applied to yet other embodiments within the scope of the claims hereto attached.

What is claimed is:

1. A method for reading the state of a magnetoresistive bit structure having a soft layer and a hard layer, the method comprising the steps of:

applying a magnetic field to the magnetoresistive bit structure in a first direction to set the state of the soft layer in a first direction;

substantially removing the magnetic field;

sensing a first sensed resistance of the magnetoresistive bit structure;

applying a magnetic field to the magnetoresistive bit structure in an opposite direction to the first direction to set the state of the soft layer in a second opposite direction;

substantially removing the magnetic field; and sensing if the resistance of the bit structure has increased or decreased relative to the first sensed resistance.

2. A method according to claim 1, wherein said sensing steps include the step of applying a sense current to the bit structure, and detecting a resulting voltage drop.

3. A method according to claim 1, wherein the bit structure is included in a sense line that includes at least one other magnetoresistive bit structure connected in series to form a sense line.

4. A method for sensing the state of a magnetoresistive bit structure of a magnetoresistive memory, the magnetoresistive bit structure being connected in series with one or more other magnetoresistive bit structures to form a sense line, each of the magnetoresistive bit structures having a soft layer and a hard layer with a common easy axis, the method comprising the steps of:

applying a magnetic field to the magnetoresistive bit structure in a first direction parallel to the easy axis to set the state of the soft layer in a first direction;

removing the magnetic field;

sensing a first sensed resistance of the sense line;

applying a magnetic field to the magnetoresistive bit structure in an opposite direction to the first direction to set the state of the soft layer in a second opposite direction;

removing the magnetic field; and sensing a second sensed resistance of the sense line.

5. A method according to claim 4, further comprising the step of determining if the first sensed resistance is larger or smaller than the second sensed resistance.

6. A method according to claim 4, wherein said applying steps include the step of providing a wordline current through a wordline that extends adjacent the magnetoresistive bit structure.

7. A method according to claim 6, wherein said current providing step provides current in a first direction to apply the magnetic field in the first direction, and provides current in the opposite direction to apply the magnetic field in the second opposite direction.

8. A method according to claim 6, wherein said first applying step includes the step of providing a wordline current through a first wordline that extends adjacent a first side of the magnetoresistive bit structure, and said second applying step includes the step of providing a wordline current through a second wordline that extends adjacent a second opposite side of the magnetoresistive bit structure.

9. A method for reading the state of a magnetoresistive bit structure having a soft layer and a hard layer, the soft layer having an initial state, the method comprising the steps of:

sensing a first sensed resistance of the magnetoresistive bit structure with the soft layer in the initial state;

setting the soft layer of the magnetoresistive bit structure to an opposite state;

sensing if the resistance of the bit structure has increased or decreased relative to the first sensed resistance;

setting the soft layer back to the initial state.

10. A method according to claim 9 wherein said first setting step includes the steps of:

applying a magnetic field to the magnetoresistive bit structure in a first direction to set the state of the soft layer to the opposite state; and substantially removing the magnetic field.

11. A method according to claim 10 wherein said second setting step includes the steps of:

applying a magnetic field to the magnetoresistive bit structure in a second opposite direction to set the state of the soft layer back to the initial state; and substantially removing the magnetic field.

12. A magnetic storage device for storing at least one bit of information, the magnetic storage device having at least one magnetoresistive bit structure having a soft layer and a hard layer, comprising:

applying means for applying a magnetic field to the magnetoresistive bit structure in a first direction and a second direction to set the state of the soft layer;

sensing means for sensing a sensed resistance of a sense line that includes the magnetoresistive bit structure; and control means for controlling said applying means and said sensing means, wherein said control means first enables said applying means to apply a magnetic field to the magnetoresistive bit structure in the first direction to set the state of the soft layer in a first state, said control means then disabling said applying means, which substantially removes the magnetic field, said control means then initiating said sensing means to sense a first sensed resistance of a sense line that includes the magnetoresistive bit structure, said control means then disabling said sensing means, and initiating said applying means to applying a magnetic field to the magnetoresistive bit structure in an opposite direction to the first direction to set the state of the soft layer in a second opposite state; said control means then disabling said applying means, which substantially removes the magnetic field, said control means then enabling said sensing means to sense if the resistance of the sense line has increased or decreased relative to the first sensed resistance.

13. A magnetic storage device according to claim 12, wherein said applying means comprises a wordline.

14. A magnetic storage device according to claim 13, wherein said applying means comprises a wordline driver for driving a wordline current in a first direction and a second direction through the wordline.

15. A magnetic storage device according to claim 12, wherein said applying means comprises a first wordline located adjacent a first side of said magnetoresistive bit structure and a second wordline located adjacent a second opposite side of said magnetoresistive bit structure.

16. A magnetic storage device according to claim 15, wherein said applying means further comprises one or more wordline drivers for selectively driving a wordline current to either the first wordline or the second wordline.

17. A magnetic storage device according to claim 12, wherein said sensing means comprises a current source.

18. A magnetic storage device according to claim 12, wherein said sensing means comprises a voltage source.

19. In a memory having a number of magnetoresistive bit structures each having a soft layer and a hard layer and arranged in a number of rows, wherein selected magnetoresistive bit structures in each row are connected together to form a corresponding sense line, the memory further having a number of wordlines, wherein each wordline extends adjacent to selected magnetoresistive bit structures, the memory also including one or more wordline drivers for providing a wordline current to each wordline, wherein each of said wordline drivers is capable of providing a wordline current in a first direction and a second opposite direction, the memory further including one or more sensing blocks for sensing a resistance of the sense lines, the improvement comprising:

a controller for controlling selected wordline drivers and selected sensing blocks, said controller enabling a selected wordline driver to provide a wordline current in a first state to set the soft layer of a selected magnetoresistive bit structure to a first state, said controller then disabling said selected wordline driver, which substantially removes the wordline current from the selected wordline, said controller then initiating said sensing block to sense a first sensed resistance of the sense line that includes the selected magnetoresistive bit structure, said controller then disabling said sensing block, and initiating said selected wordline driver to provide a wordline current in the second opposite direction to set the soft layer of the selected magnetoresistive bit structure to a second opposite state, said controller then disabling said selected wordline driver, which substantially removes the wordline current from the selected wordline, said controller then enabling said sensing block to sense if the resistance of the sense line that includes the selected magnetoresistive bit structure has increased or decreased relative to the first sensed resistance.

20. In a memory having a number of magnetoresistive bit structures each having a soft layer and a hard layer and arranged in a number of rows, wherein selected magnetoresistive bit structures in each row are connected together to form a corresponding sense line, the memory further having a number of wordlines, wherein selected pairs of wordlines extends above and below a selected magnetoresistive bit structure, the memory also including one or more wordline drivers for providing a wordline current to each wordline, wherein each of said wordline drivers is capable of alternatively providing a wordline current to the wordlines of a selected pair of wordlines, the memory further including one or more sensing blocks for sensing a resistance of the sense lines, the improvement comprising:

a controller for controlling selected wordline drivers and selected sensing blocks, said controller enabling a selected wordline driver to provide a wordline current in a first one of a selected pair of wordlines to set the soft layer of a selected magnetoresistive bit structure in a first state, said controller then disabling said selected wordline driver, which substantially removes the wordline current from the selected wordline pair, said controller then initiating said sensing block to sense a first sensed resistance of the sense line that includes the selected magnetoresistive bit structure, said controller then disabling said sensing block, and initiating said selected wordline driver to provide a wordline current in the other one of the selected pair of wordlines to set the soft layer of the selected magnetoresistive bit structure in a second opposite state, said controller then disabling said selected wordline driver, which substantially removes the wordline current from the selected wordline pair, said controller then enabling said sensing block to sense if the resistance of the sense line that includes the selected magnetoresistive bit structure has increased or decreased relative to the first sensed resistance.

* * * * *

UNITED STATES PATENT AND TRADEMARK OFFICE
CERTIFICATE OF CORRECTION

PATENT NO. : 6,134,138 Page 1 of 1
DATED : October 17, 2000
INVENTOR(S) : Yong Lu and Theodore Zhu It is certified that error appears in the above-identified patent and that said Letters Patent is hereby corrected as shown below:

<u>Column 1,</u>
Line 3, please add the following paragraph:

-- This invention was made with Government support under Contract Number N00014-96-C-2114 awarded by NRL (Naval Research Laboratory). The Government has certain rights in this invention. --

Signed and Sealed this

Second Day of September, 2003

JAMES E. ROGAN
*Director of the United States Patent and Trademark Office*